(12) United States Patent
Tseng et al.

(10) Patent No.: US 12,150,274 B2
(45) Date of Patent: Nov. 19, 2024

(54) SELF CLEANING COLD PLATE

(71) Applicant: Dell Products L.P., Round Rock, TX (US)

(72) Inventors: Chun-Fa Tseng, Nei-hu District (TW); Steven Lu, Taipei (TW)

(73) Assignee: Dell Products L.P., Round Rock, TX (US)

( * ) Notice: Subject to any disclaimer, the term of this patent is extended or adjusted under 35 U.S.C. 154(b) by 278 days.

(21) Appl. No.: 17/871,614

(22) Filed: Jul. 22, 2022

(65) Prior Publication Data
US 2024/0032245 A1    Jan. 25, 2024

(51) Int. Cl.
*H05K 7/20* (2006.01)

(52) U.S. Cl.
CPC ..... *H05K 7/20281* (2013.01); *H05K 7/20254* (2013.01); *H05K 7/20272* (2013.01)

(58) Field of Classification Search
CPC ........... H05K 7/20281; H05K 7/20272; H05K 7/20254; H05K 7/20781
See application file for complete search history.

(56) References Cited

U.S. PATENT DOCUMENTS

| | | | | |
|---|---|---|---|---|
| 7,713,485 | B2* | 5/2010 | Parng | ................. F16K 99/0001 |
| | | | | 422/504 |
| 10,091,909 | B2* | 10/2018 | Brunschwiler | ....... H01L 23/473 |
| 2018/0107256 | A1 | 4/2018 | Mundt et al. | |
| 2018/0279510 | A1 | 9/2018 | Johnson et al. | |
| 2021/0164587 | A1* | 6/2021 | Zhang | ................. F16K 99/0028 |

* cited by examiner

*Primary Examiner* — Lionel Nouketcha
(74) *Attorney, Agent, or Firm* — Larson Newman, LLP

(57) ABSTRACT

A cooling liquid flow switch includes top and bottom plates, and first and second rotatable inserts. The first rotatable insert is located within the first opening of the top plate. When in a first position, the first rotatable insert creates a first liquid flow configuration within the flow channels of the top plate. When in a second position, the first rotatable insert creates a second liquid flow configuration within the flow channels of the top plate. The second rotatable insert is located within the second opening of the bottom plate. When in a third portion, the second rotatable insert creates a third liquid flow configuration within the flow channels of the bottom plate. When in a second position, the second rotatable insert creates a fourth liquid flow configuration within the flow channels of the bottom plate.

20 Claims, 7 Drawing Sheets

SELF CLEANING COLD PLATE

FIELD OF THE DISCLOSURE

The present disclosure generally relates to information handling systems, and more particularly relates to a self cleaning cold plate.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs, and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A cooling liquid flow switch includes top and bottom plates, and first and second rotatable inserts. The top plate includes a first opening in a center of the first top plate, and multiple flow channels. The first rotatable insert is located within the first opening of the top plate. The first rotatable insert may rotate between first and second positions. When in the first position, the first rotatable insert may create a first liquid flow configuration within the flow channels of the top plate. When in the second position, the first rotatable insert may create a second liquid flow configuration within the flow channels of the top plate. The bottom plate includes a second opening in a center of the bottom top plate, and multiple flow channels. The second rotatable insert is located within the second opening of the bottom plate. The second rotatable insert may rotate between the first and second positions. When in the first portion, the second rotatable insert may create a third liquid flow configuration within the flow channels of the bottom plate. When in the second position, the second rotatable insert may create a fourth liquid flow configuration within the flow channels of the bottom plate.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
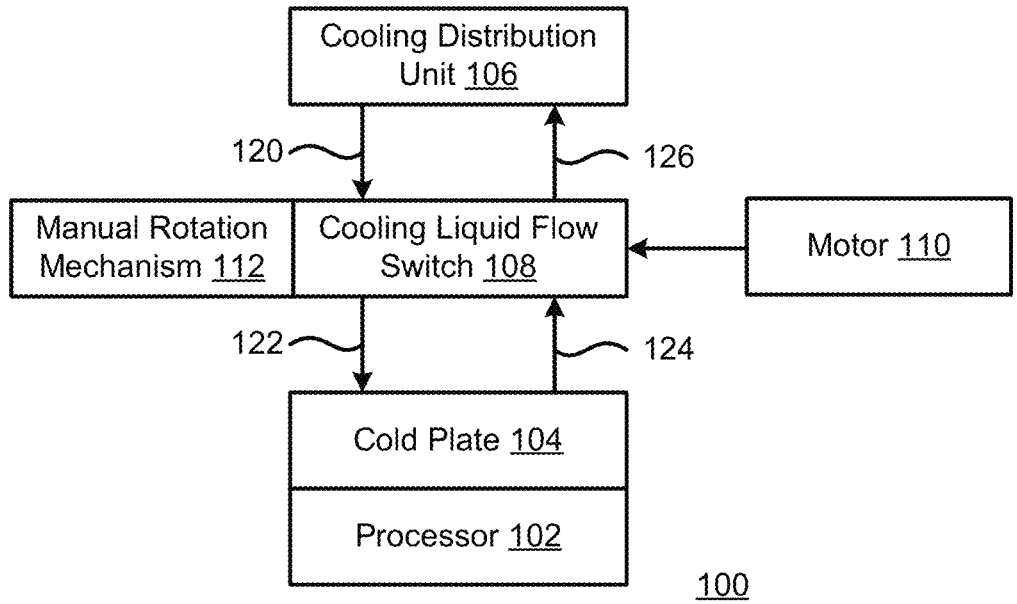
FIGS. 1 and 2 are block diagrams of a portion of an information handling system according to at least one embodiment of the present disclosure.
Figure 2:
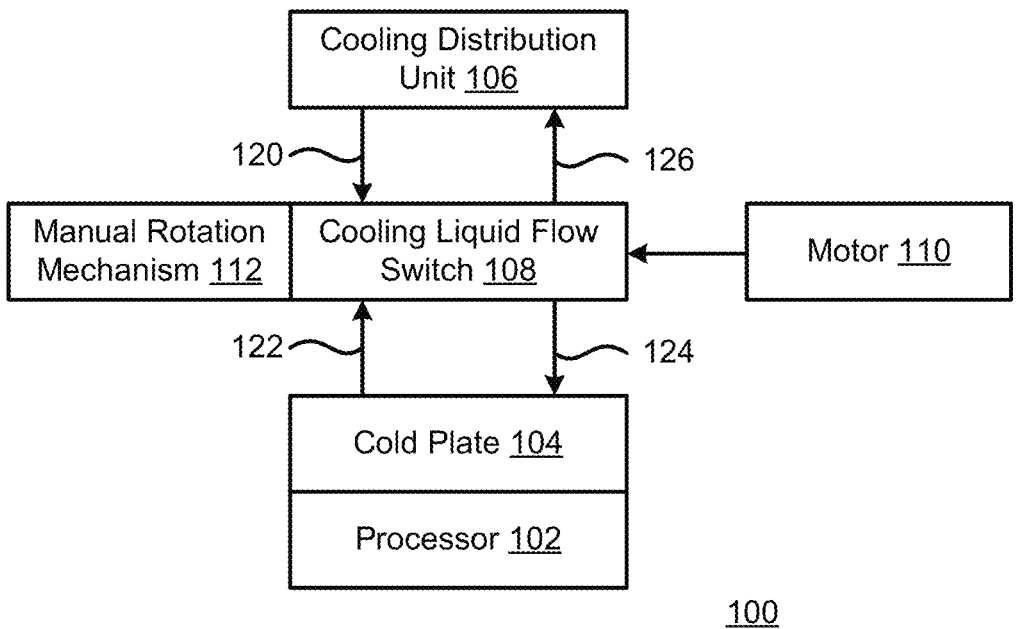

FIGS. 1-2 illustrate a portion of an information handling system 100 according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), blade server or rack server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Information handling system 100 includes a processor 102, a cold plate 104, a cooling distribution unit (CDU) 106, a cooling liquid flow switch 108, a motor 110, and a manual rotation mechanism 112. In an example, information handling system 100 may be a server rack system including CDU 106 and multiple servers with components needing liquid cooling from the CDU. Processor 102 is in physical communication with cold plate 104. CDU 106 is coupled to cooling liquid flow switch 108, which in turn is coupled to cold plate 104. While cooling liquid flow switch 108 is illustrated outside CDU 106, the cooling liquid flow switch may be one of multiple components within the CDU without varying from the scope of this disclosure. Alternatively, cooling liquid flow switch 108 may be located within a server that includes cold plate 104 and processor 102.

In an example, cold plate 104, CDU 106, and cooling liquid flow switch 108 may combine to provide liquid cooling of processor 102. In this example, CDU 106 may receive a cold cooling liquid from an external heat exchanger and provide hot cooling liquid back to the external heat exchanger. CDU 106 provides the cold cooling liquid to cooling liquid flow switch 108, and receives hot cooling liquid from the cooling flow switch. Cooling liquid flow switch 108 may provide the cold cooling liquid to cold plate 104 and receive hot cooling liquid from the cold plate.

In previous information handling systems, the coolant pipes providing the cold liquid from the CDU to the cold plate may cause dirt or other type of debris to build up on the micro channel surface of the cold plate. In these previous information handling systems, the filter in the CDU was not inline with the cold liquid coolant pipes. The dirt or debris would continue to build up on the cold plate of the previous information handling systems because the flow of the cooling liquid through the cold plate was continuously in the same direction. Information handling system 100 may be improved by cooling liquid flow switch 108 reversing the cooling liquid flow through cold plate 104 to remove the dirt or debris build up on the micro channels of the cold plate. When the cooling liquid flow switch 108 reverses the cooling liquid flow, the dirt and debris from cold plate 104 may be provided to the filter of CDU 106.

Referring to FIG. 1, the cooling liquid within information handling system 100 may have a particular flow through CDU 106, cooling liquid flow switch 108, and cold plate 104. For example, a normal cooling liquid flow may include cold liquid from CDU 106 to cooling liquid flow switch 108 through pipe 120, and from the cooling liquid flow switch to cold plate 104 through pipe 122. This normal cooling liquid flow may also include hot liquid from cold plate 104 to cooling liquid flow switch 108 through pipe 124, and from the cooling liquid flow switch to CDU 106 through pipe 126. In an example, CDU 106 may include a filter, which may receive the hot liquid and filter the hot liquid before it is provided to the external heat exchanger.

During operation of information handling system 100, a determination to reverse the cooling liquid flow to remove dirt and debris from cold plate 104 may be made in any suitable manner. For example, the determination may be based on a particular amount of time, a user input, or the like. In response to the determination that the cooling liquid flow should be reversed, motor 110 may activate, or a user may utilize manual rotation mechanism 112, and rotate an insert within cooling liquid flow switch 108 as will be described below with respect to FIGS. 3-7 below. In response to the rotation of the insert within cooling liquid flow switch 108, the cooling liquid flow may be reversed as described with respect to FIG. 2.

Referring to FIG. 2, cooling liquid flow switch creates a reverse cooling liquid flow within information handling system 100. For example, the cooling liquid within information handling system 100 may have a particular reverse flow through CDU 106, cooling liquid flow switch 108, and cold plate 104. In this example, the reverse cooling liquid flow may include cold liquid from CDU 106 to cooling liquid flow switch 108 through pipe 120, and from the cooling liquid flow switch to cold plate 104 through pipe 124. This reverse cooling liquid flow may also include hot liquid from cold plate 104 to cooling liquid flow switch 108 through pipe 122, and from the cooling liquid flow switch to CDU 106 through pipe 126.

As shown in FIGS. 1 and 2, the cooling liquid flow between CDU 106 and cooling liquid flow switch 108 does not change between the normal cooling liquid flow and the reverse cooling flow, but the cooling liquid flow does change between the cooling liquid flow switch and cold plate 104. In an example, the cooling liquid flow between CDU 106 and cooling liquid flow switch 108 remains the same in both the normal flow and the reverse flow because the CDU connections between the CDU and an external heat exchanger never change. In this example, the cold and hot liquid pipes 120 and 122 need to remain the same as well. In the reverse cooling liquid flow, the pipes to carry the cold and hot liquid are swapped as compared to the normal flow. In an example, the switching of the cooling liquid flow may cause the cooling liquid to flow through cold plate 104 in an opposite direction as compared to the normal flow. This reverse or opposite flow of cooling liquid through cold plate 104 may cause the build up of dirt or debris to be removed from the micro channels of the cold plate. The reversing of the cooling liquid flow is performed within cooling liquid flow switch 108 as will be described with respect to FIGS. 3-7 below.

Figure 3:
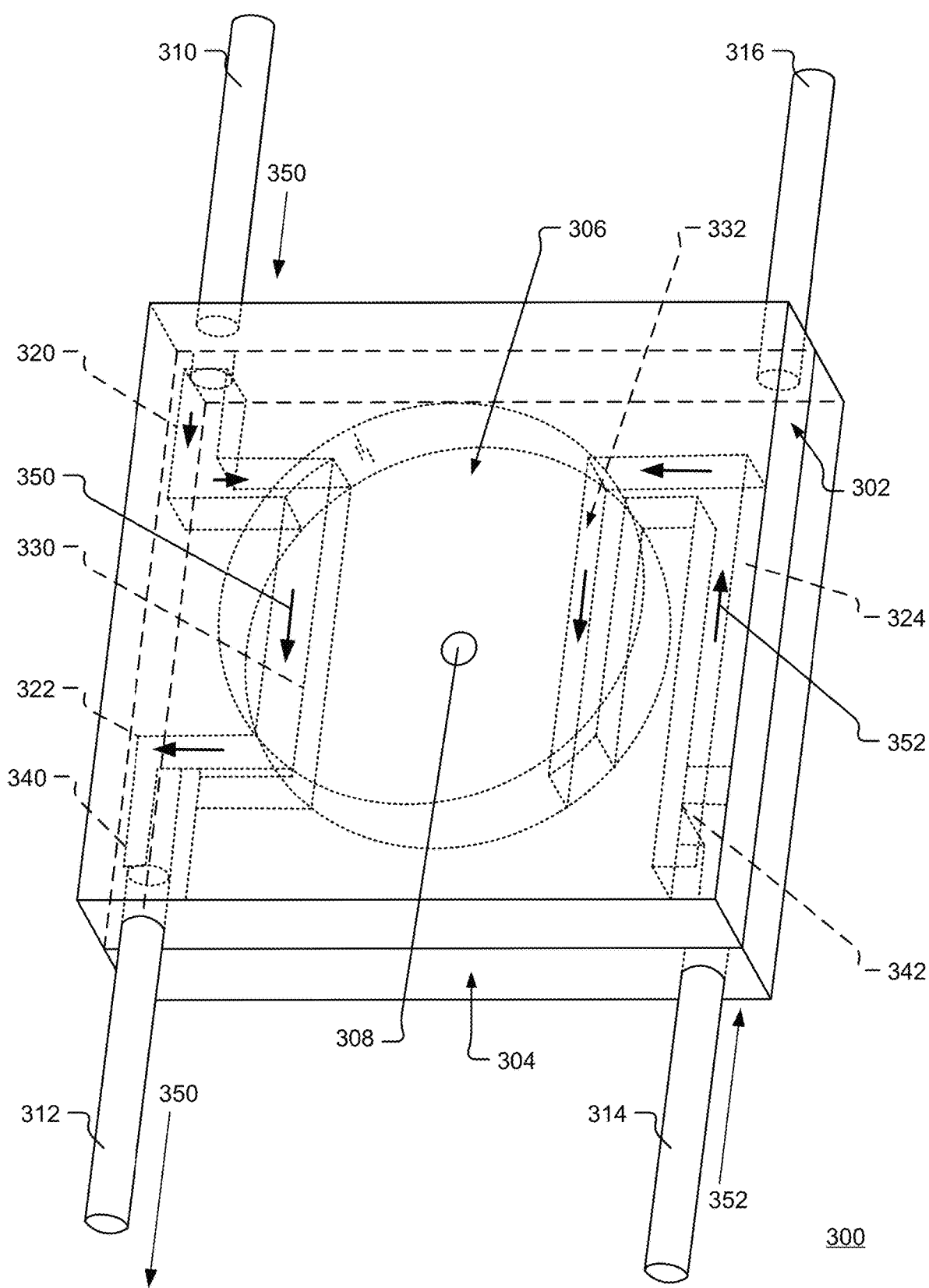
FIGS. 3-7 are diagrams of a cooling liquid flow switch according to at least one embodiment of the present disclosure.
Figure 4:
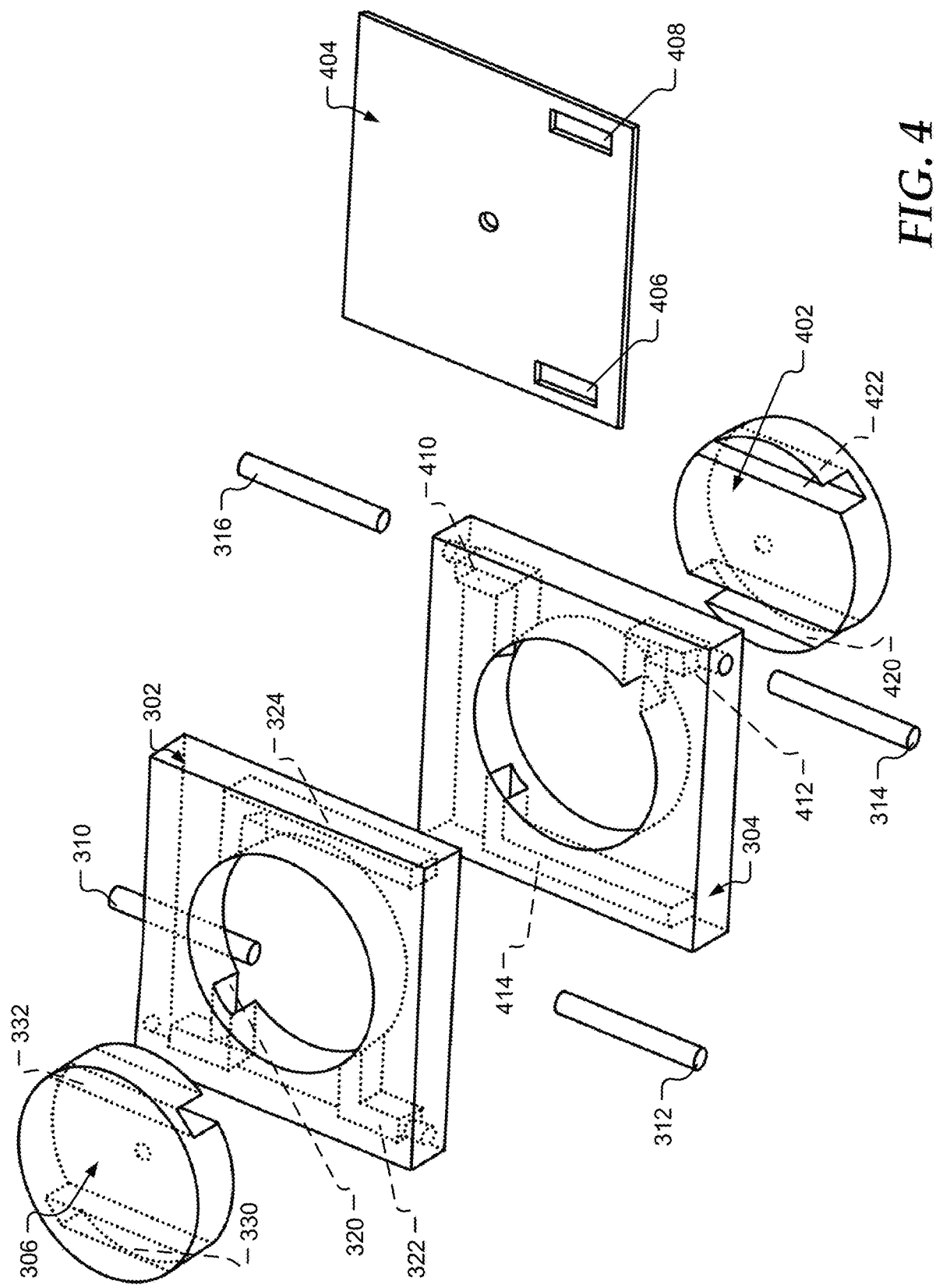
Figure 5:
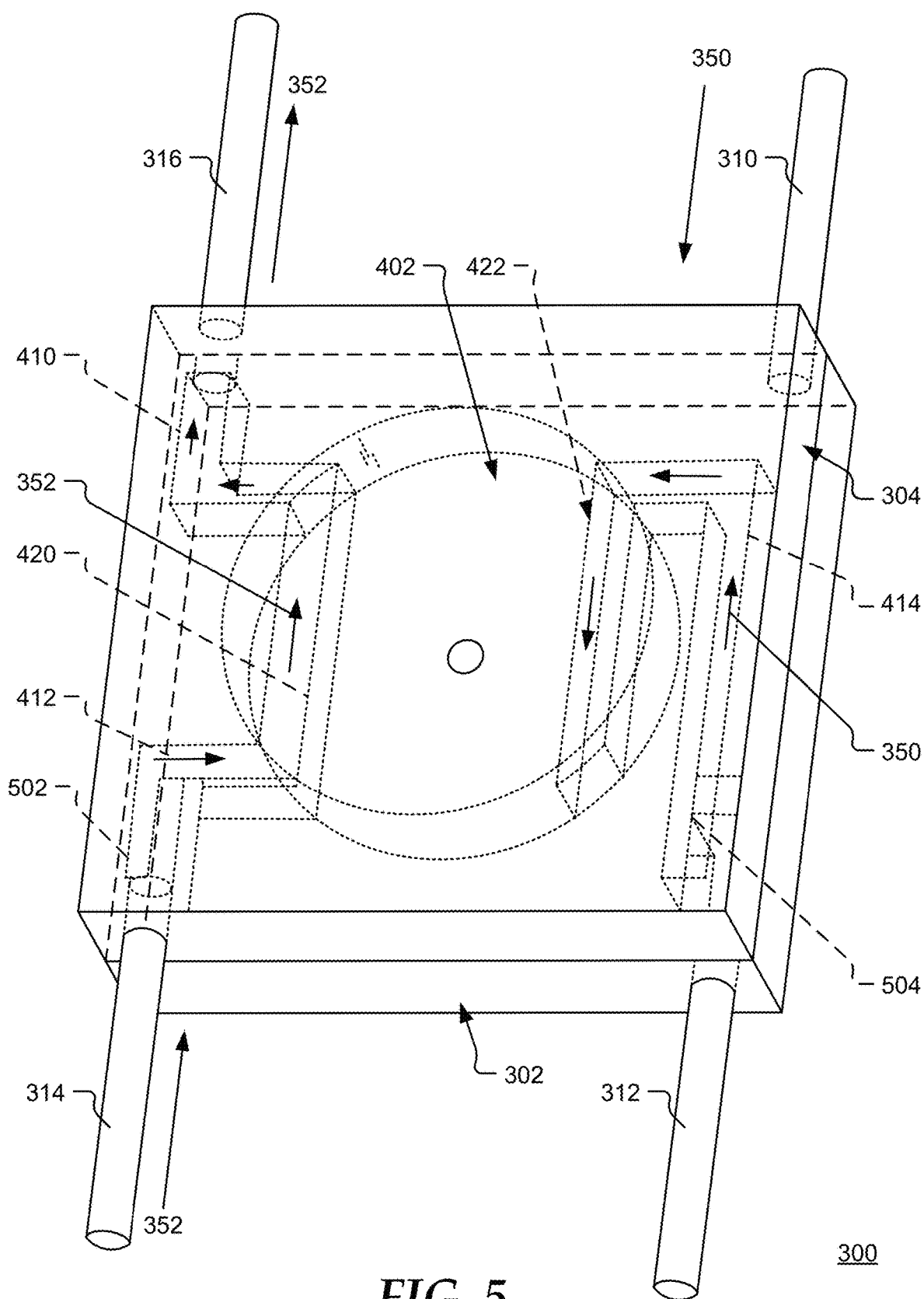
Figure 6:
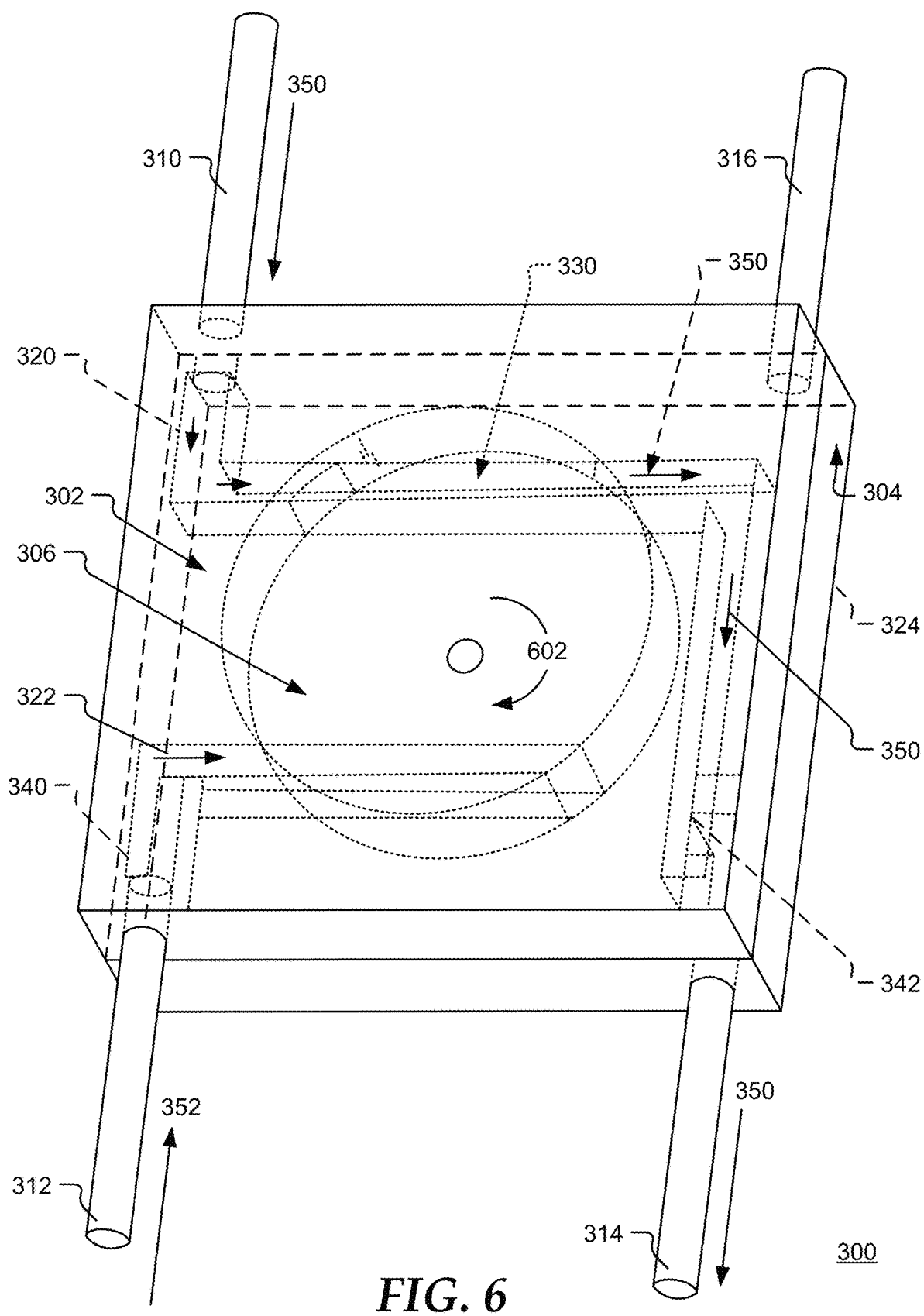
Figure 7:
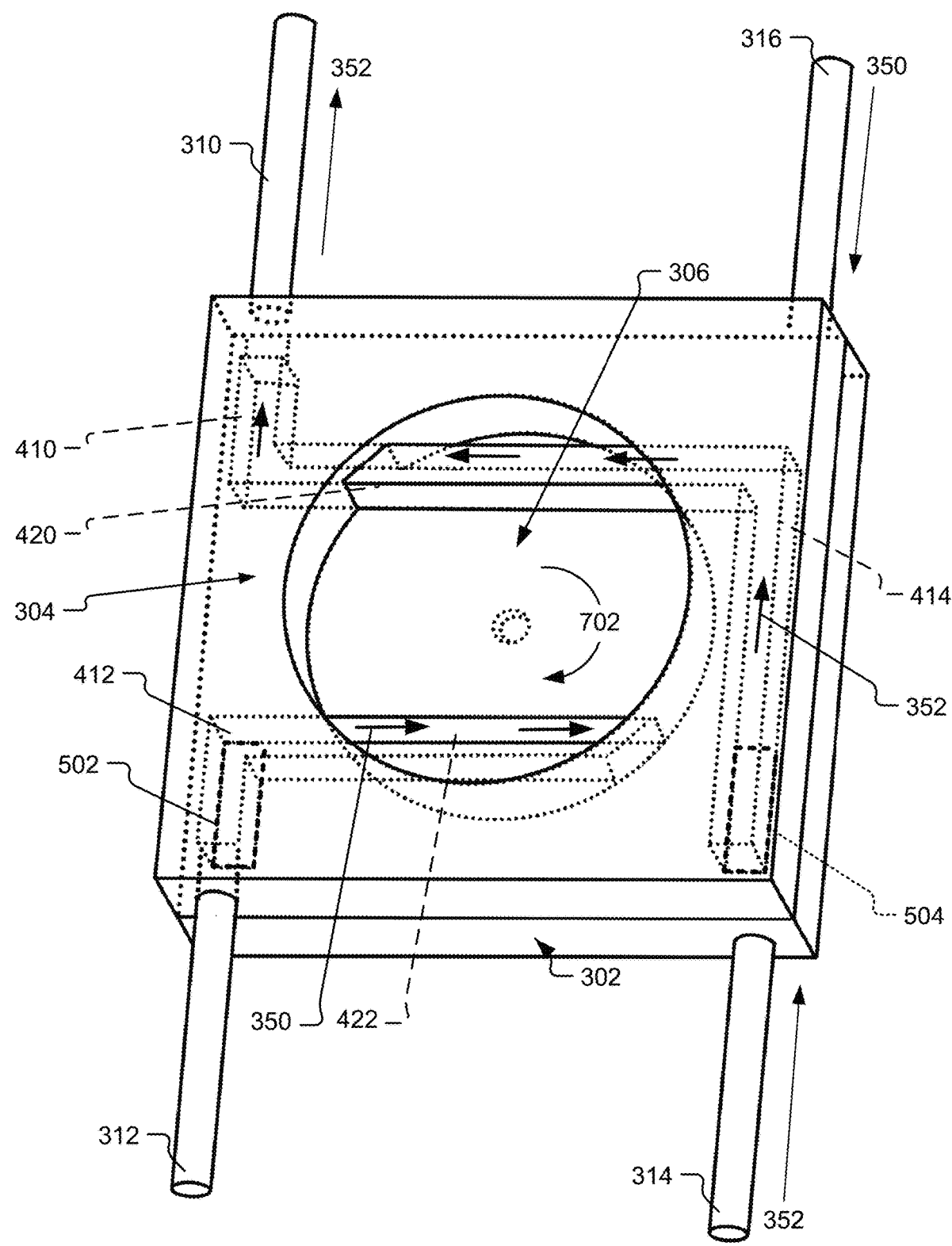

FIGS. 3-7 illustrate a cooling liquid flow switch 300 according to at least one embodiment of the present disclosure. Cooling liquid flow switch 300 may be substantially similar to cooling liquid flow switch of FIGS. 1 and 2. Cooling liquid flow switch 300 includes a top plate 302 and a bottom plate 304, and an insert 306 located within an opening of the top plate. As shown in FIGS. 4, 5, and 7, cooling liquid flow switch 300 further includes an insert 402 located within an opening of bottom portion 304. Cooling liquid flow switch 300 also includes a rod 308 substantially in the center of inserts 306 and 402 to hold the inserts together and cause the inserts to rotate at substantially the same time.

Pipes 310 and 312 are connected to top plate 302 and pipes 314 and 316 are connected to bottom plate 304. As illustrated in FIG. 3, pipe 310 is connected to a first edge of top plate 302 and pipe 312 is connected to a second edge of the top plate. In an example, pipes 310 and 312 are connected substantially near a third edge of top plate 302. The first and second edges of top plate 302 are opposite of each other, and third and fourth edges of the top plate are opposite of each other. Pipe 316 is connected to a first edge of bottom plate 304 and pipe 314 is connected to a second edge of the bottom plate. In an example, pipes 314 and 316 are connected substantially near a fourth edge of bottom plate 304. The third and fourth edges of bottom plate 304 are opposite of each other, and third and fourth edges of the top plate are opposite of each other. In an example, the third edge of top plate 302 is on an opposite side of cooling liquid flow switch 300 as compared to the fourth edge of bottom plate 304. In this example, pipes 310 and 312 may be connected along one side of cooling liquid flow switch 300 and pipes 314 and 316 may be connected to an opposite side of the cooling liquid flow switch.

As shown in FIG. 3, top plate 302 includes flow channels 320, 322, and 324. Flow channel 320 is connected to pipe 310 at the first edge of top plate 302 and routed within the top plate along the third edge for a particular distance. At the particular distance, flow channel 320 changes directions and is routed toward and intersects the opening of top plate 302. In an example, flow channel 322 is connected to pipe 312 at the second edge of the top plate and routed within the top plate along the third edge for a particular distance. At the particular distance, flow channel 322 changes directions and is routed toward and intersects the opening of top plate 302. In an example, flow channel 322 may include an opening 340 to enable cooling liquid to flow between the flow channel and a flow channel of bottom plate 304. Flow channel 324 is routed within top plate 302 starting near the second edge of the top plate and is routed along the fourth edge for a particular distance. At the particular distance, flow channel 324 changes directions and is routed toward and intersects the opening of top plate 302. In an example, flow channel 324 may include an opening 342 to enable cooling liquid to flow between the flow channel and a flow channel of bottom plate 304.

In an example, insert 306 includes flow channels 330 and 332. In this example, flow channels are routed within insert 306 substantially parallel to each other but on opposite edges of insert 306. Both ends of flow channel 330 intersect with edges of insert 306. Similarly, both ends of flow channel 330 intersect with edges of insert 306. As shown in FIG. 3, insert 306 is placed in a first position. When in the first position, flow channel 330 of insert 306 connects with both flow channel 320 and flow channel 322 of top plate 302. In the first position, cooling liquid may flow through pipe 310, flow channels 320, 330, and 322, and pipe 312 as illustrated by arrows 350. When insert 306 is in the first position, cold cooling liquid may flow from CDU 106 of FIG. 1, through pipe 310, flow channels 320, 330, and 322, and pipe 312, and into cold plate 104 of FIG. 1. Also while insert 306 is in the first position, cooling liquid from pipe 314 may enter flow channel 324 via opening 342 of top plate 302. In this situation, the cooling liquid from pipe 314 may flow along flow channels 324 and 332 and dead end into a surface of top plate 302 as illustrated by arrows 352.

Referring to FIG. 4, an exploded view of cooling liquid flow switch 300 is shown. Cooling liquid flow switch includes an insert 402 and a middle plate 404. Middle plate 404 includes flow openings 406 and 408. Bottom plate 304 includes flow channels 410, 412, and 414. Flow channel 410 may be connected to pipe 316 at the first edge of bottom plate 304 and routed within the bottom plate along the fourth edge for a particular distance. At the particular distance, flow channel 410 changes directions and is routed towards and intersects the opening of bottom plate 304. In an example, flow channel 412 may be connected to pipe 314 at the second edge of the bottom plate and routed within the bottom plate along the fourth edge for a particular distance. At the particular distance, flow channel 412 changes directions and is routed towards and intersects the opening of bottom plate 304.

In an example, flow channel 412 may include an opening to enable cooling liquid to flow between the flow channel and flow channel 314 of top plate 302 via flow opening 408 of middle plate 404. Flow channel 414 is routed within bottom plate 304 starting near the second edge of the bottom plate and is routed along the third edge for a particular distance. At the particular distance, flow channel 414 changes directions and is routed towards and intersects the opening of bottom plate 304. In an example, flow channel 414 may include an opening to enable cooling liquid to flow between the flow channel and flow channel 322 of top plate 302 via flow opening 406 of middle plate 404. Insert 402 includes flow channels 420 and 422 as will be described with respect to FIG. 5.

Referring to FIG. 5, a bottom view of cooling liquid flow switch 300 is illustrated. In this view, connections between flow channels 410 and 412 of bottom plate 304 with flow channel 420 of insert 402 are shown and described, as well as connections between flow channel 414 of the bottom plate with flow channel 422 of the insert. As illustrated in FIG. 5, pipe 316 is connected to a first edge of bottom plate 304 and pipe 314 is connected to a second edge of the bottom plate.

In an example, pipes 314 and 316 are connected substantially near a fourth edge of bottom plate 304.

In an example, flow channels 420 and 422 are routed within insert 402 substantially parallel to each other but on opposite edges of insert 402. Both ends of flow channel 420 intersect with edges of insert 402. Similarly, both ends of flow channel 422 intersect with edges of insert 402. As shown in FIG. 5, insert 402 is placed in a first position. When in the first position, flow channel 420 of insert 402 connects with both flow channel 410 and flow channel 412 of bottom plate 304. In the first position, cooling liquid may flow through pipe 314, flow channels 412, 420, and 410, and pipe 316 as illustrated by arrows 352. When insert 402 is in the first position, hot cooling liquid may flow from cold plate 104 of FIG. 1, through pipe 314, flow channels 412, 420, and 410, and pipe 306, and into CDU 116 of FIG. 1. Also while insert 402 is in the first position, cooling liquid from pipe 310 may enter flow channel 414 via opening 504 of bottom plate 304. In this situation, the cooling liquid from pipe 310 may flow along flow channels 414 and 422 and dead end into a surface of bottom plate 304 as illustrated by arrows 350.

Referring to FIG. 6, insert 306 may be rotated, via motor 110 or manual rotation mechanism 112 of FIG. 1, from the first position to a second position. In an example, insert 306 may be rotated in any suitable direction, such as in the direction of arrow 602. When insert 306 is in the second position, flow channels 330 and 332 are in a direction that is perpendicular to the direction when insert 306 was in the first position. When in the second position, flow channel 330 of insert 306 connects with both flow channel 320 and flow channel 324 of top plate 302. In the second position, cooling liquid may flow through pipe 310, flow channels 320, 330, and 324, opening 342, and pipe 312 as illustrated by arrows 350. When insert 306 is in the second position, cold cooling liquid may flow from CDU 106 of FIG. 1, through pipe 310, flow channels 320, 330, and 324, opening 342, and pipe 312, and into cold plate 104 of FIG. 1. Also while insert 306 is in the first position, cooling liquid from pipe 312 may enter flow channel 322 via opening 340 of top plate 302. In this situation, the cooling liquid from pipe 312 may flow along flow channels 322 and 332 and dead end into a surface of top plate 302 as illustrated by arrows 352.

Referring to FIG. 7, insert 402 may be rotated, via motor 110 or manual rotation mechanism 112 of FIG. 1, from the first position to the second position. In an example, insert 402 may be rotated in any suitable direction, such as in the direction of arrow 702. When insert 402 is in the second position, flow channels 420 and 422 are in a direction that is perpendicular to the direction when insert 402 was in the first position. When in the second position, flow channel 420 of insert 402 connects with both flow channel 410 and flow channel 414 of bottom plate 304. In the second position, cooling liquid may flow through pipe 314, opening 504, flow channels 414, 420, and 410, and pipe 310 as illustrated by arrows 352. When insert 402 is in the second position, hot cooling liquid may flow from cold plate 104 of FIG. 1, through pipe 314, opening 504, flow channels 414, 420, and 410, and pipe 310, and into CDU 106 of FIG. 1. Also while insert 402 is in the second position, cooling liquid from pipe 316 may enter flow channel 412 via opening 502 of bottom plate 304. In this situation, the cooling liquid from pipe 316 may flow along flow channels 412 and 422 and dead end into a surface of bottom plate 304 as illustrated by arrows 350.

As illustrated in FIGS. 3 and 5-7, cooling liquid flow may be reversed with respect to pipes 312 and 314 based on whether inserts 306 and 402 are in the first position or the second position. In an example, the cooling liquid flow between CDU 106 and cooling liquid flow switch 300 need to remain the same when inserts 306 and 402 are both in the first and second position because the CDU connections between the CDU and an external heat exchanger never change. In this example, the cold and hot liquid pipes 310 and 316 need to remain the same as well. When inserts 306 and 402 are in the second position, pipes 312 and 314 to carry the cold and hot liquid are swapped as compared to when the inserts are in the first position. In an example, the switching of the cooling liquid flow may cause the cooling liquid to flow through cold plate 104 of FIG. 1 in an opposite direction as compared to when inserts 306 and 402 are in the first position. This reverse or opposite flow of cooling liquid through cold plate 104 of FIG. 1 may cause the build up of dirt or debris to be removed from the micro channels of the cold plate.

Figure 8:
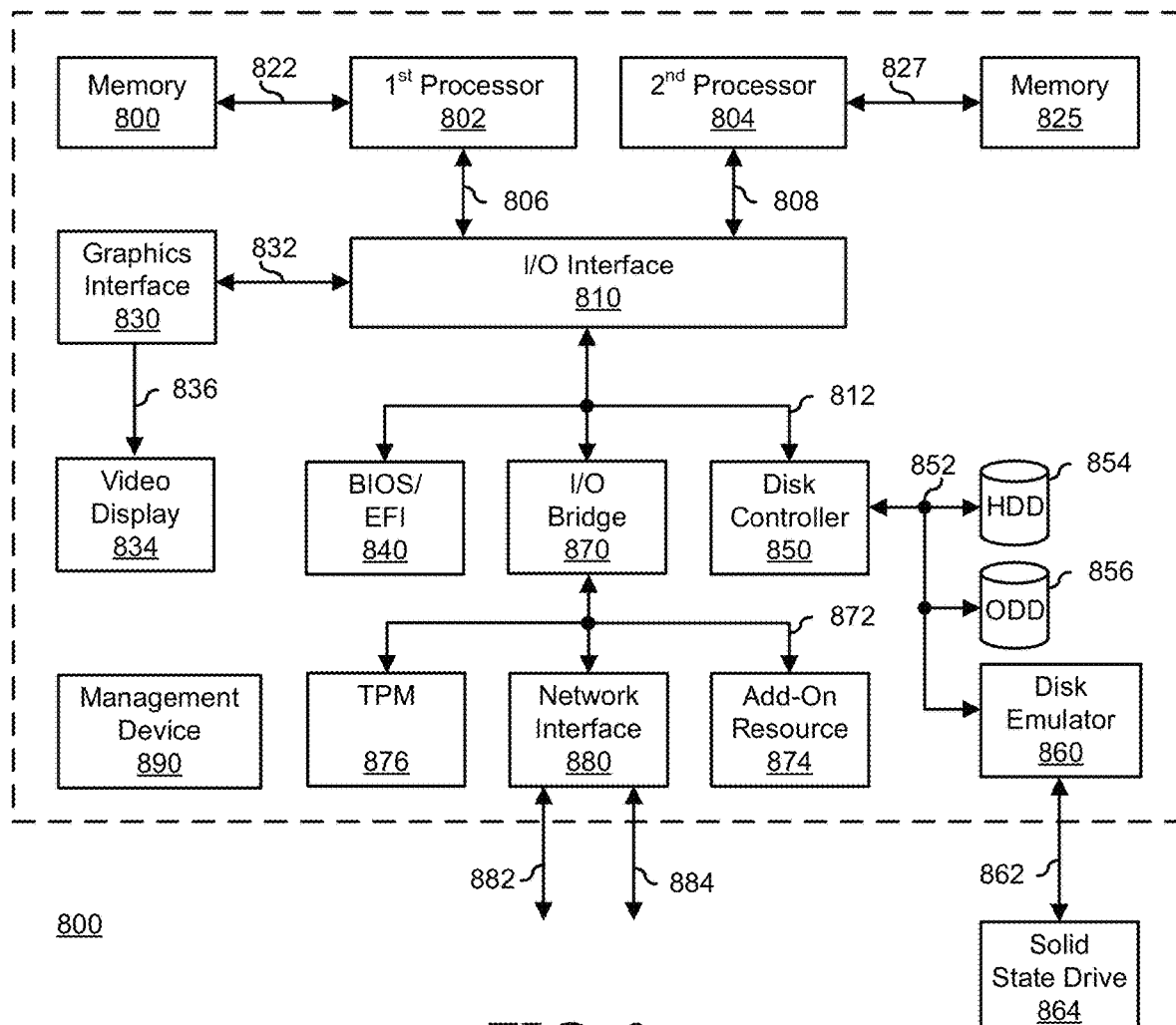
FIG. 8 is a block diagram of a general information handling system according to an embodiment of the present disclosure.

FIG. 8 shows a generalized embodiment of an information handling system 800 according to an embodiment of the present disclosure. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 800 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 800 can include processing resources for executing machine-executable code, such as a central processing unit (CPU), a programmable logic array (PLA), an embedded device such as a System-on-a-Chip (SoC), or other control logic hardware. Information handling system 800 can also include one or more computer-readable medium for storing machine-executable code, such as software or data. Additional components of information handling system 800 can include one or more storage devices that can store machine-executable code, one or more communications ports for communicating with external devices, and various input and output (I/O) devices, such as a keyboard, a mouse, and a video display. Information handling system 800 can also include one or more buses operable to transmit information between the various hardware components.

Information handling system 800 can include devices or modules that embody one or more of the devices or modules described below and operates to perform one or more of the methods described below. Information handling system 800 includes a processors 802 and 804, an input/output (I/O) interface 810, memories 820 and 825, a graphics interface 830, a basic input and output system/universal extensible firmware interface (BIOS/UEFI) module 840, a disk controller 850, a hard disk drive (HDD) 854, an optical disk drive (ODD) 856, a disk emulator 860 connected to an external solid state drive (SSD) 862, an I/O bridge 870, one or more add-on resources 874, a trusted platform module (TPM) 876, a network interface 880, a management device 890, and a power supply 895. Processors 802 and 804, I/O interface 810, memory 820, graphics interface 830, BIOS/UEFI module 840, disk controller 850, HDD 854, ODD 856, disk emulator 860, SSD 862, I/O bridge 870, add-on resources 874, TPM 876, and network interface 880 operate together to provide a host environment of information handling system 800 that operates to provide the data processing functionality of the information handling system. The host environment operates to execute machine-executable code, including platform BIOS/UEFI code, device firmware, operating system code, applications, programs, and the like, to perform the data processing tasks associated with information handling system 800.

In the host environment, processor 802 is connected to I/O interface 810 via processor interface 806, and processor 804 is connected to the I/O interface via processor interface 808. Memory 820 is connected to processor 802 via a memory interface 822. Memory 825 is connected to processor 804 via a memory interface 827. Graphics interface 830 is connected to I/O interface 810 via a graphics interface 832 and provides a video display output 836 to a video display 834. In a particular embodiment, information handling system 800 includes separate memories that are dedicated to each of processors 802 and 804 via separate memory interfaces. An example of memories 820 and 825 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 840, disk controller 850, and I/O bridge 870 are connected to I/O interface 810 via an I/O channel 812. An example of I/O channel 812 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 810 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 840 includes BIOS/UEFI code operable to detect resources within information handling system 800, to provide drivers for the resources, initialize the resources, and access the resources. BIOS/UEFI module 840 includes code that operates to detect resources within information handling system 800, to provide drivers for the resources, to initialize the resources, and to access the resources.

Disk controller 850 includes a disk interface 852 that connects the disk controller to HDD 854, to ODD 856, and to disk emulator 860. An example of disk interface 852 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 860 permits SSD 864 to be connected to information handling system 800 via an external interface 862. An example of external interface 862 includes a USB interface, an IEEE 3394 (Firewire) interface, a proprietary interface, or a combination thereof. Alternatively, solid-state drive 864 can be disposed within information handling system 800.

I/O bridge 870 includes a peripheral interface 872 that connects the I/O bridge to add-on resource 874, to TPM 876, and to network interface 880. Peripheral interface 872 can be the same type of interface as I/O channel 812 or can be a different type of interface. As such, I/O bridge 870 extends the capacity of I/O channel 812 when peripheral interface 872 and the I/O channel are of the same type, and the I/O bridge translates information from a format suitable to the I/O channel to a format suitable to the peripheral channel 872 when they are of a different type. Add-on resource 874 can include a data storage system, an additional graphics interface, a network interface card (NIC), a sound/video processing card, another add-on resource, or a combination thereof. Add-on resource 874 can be on a main circuit board, on separate circuit board or add-in card disposed within information handling system 800, a device that is external to the information handling system, or a combination thereof.

Network interface 880 represents a NIC disposed within information handling system 800, on a main circuit board of the information handling system, integrated onto another component such as I/O interface 810, in another suitable location, or a combination thereof. Network interface device 880 includes network channels 882 and 884 that provide interfaces to devices that are external to information handling system 800. In a particular embodiment, network channels 882 and 884 are of a different type than peripheral channel 872 and network interface 880 translates information from a format suitable to the peripheral channel to a format suitable to external devices. An example of network channels 882 and 884 includes InfiniBand channels, Fibre Channel channels, Gigabit Ethernet channels, proprietary channel architectures, or a combination thereof. Network channels 882 and 884 can be connected to external network resources (not illustrated). The network resource can include another information handling system, a data storage system, another network, a grid management system, another suitable resource, or a combination thereof.

Management device 890 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 800. In particular, management device 890 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 800, such as system cooling fans and power supplies. Management device 890 can include a network connection to an external management system, and the management device can communicate with the management system to report status information for information handling system 800, to receive BIOS/UEFI or system firmware updates, or to perform other task for managing and controlling the operation of information handling system 800.

Management device 890 can operate off of a separate power plane from the components of the host environment so that the management device receives power to manage information handling system 800 when the information handling system is otherwise shut down. An example of management device 890 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 890 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. A cooling liquid flow switch for an information handling system, the cooling liquid flow switch comprising:
   a top plate including:
      a first opening in a center of the first top plate; and
      a first plurality of flow channels;
   a first rotatable insert located within the first opening of the top plate, the first rotatable insert to rotate between first and second positions, the first rotatable insert to create a first liquid flow configuration within the first flow channels when in the first position, and the first rotatable insert to create a second liquid flow configuration within the first flow channels when in the second position;
   a bottom plate including:
      a second opening in a center of the bottom top plate; and
      a second plurality of flow channels; and
   a second rotatable insert located within the second opening of the bottom plate, the second rotatable insert to rotate between the first and second positions, the second rotatable insert to create a third liquid flow configuration within the second flow channels when in the first position, and the second rotatable insert to create a fourth liquid flow configuration within the second flow channels when in the second position.

2. The cooling liquid flow switch of claim 1, further comprising a middle plate including third and fourth openings, the middle plate located in between the top and bottom plate, the third and fourth openings connect the first and second flow channels.

3. The cooling liquid flow switch of claim 1, further comprising a rod extending between the first and second rotatable inserts, wherein the rod causes the first and second rotatable inserts to rotate at a same time.

4. The cooling liquid flow switch of claim 1, further comprising:
   a first cooling liquid pipe in physical communication with a first edge of the top plate near a second edge of the top plate; and
   a second cooling liquid pipe in physical communication with a third edge of the top plate near the second edge of the top plate.

5. The cooling liquid flow switch of claim 4, further comprising:

a third cooling liquid pipe in physical communication with a third edge of the bottom plate near a fourth edge of the bottom plate; and a fourth cooling liquid pipe in physical communication with a fifth edge of the bottom plate near the fourth edge of the top plate.

6. The cooling liquid flow switch of claim 5, when the top and bottom plates are stacked on each other, the second edge of the top plate and the fourth edge of the bottom plate are at distal ends of the top and bottom plates.

7. The cooling liquid flow switch of claim 1, wherein the first position of the first and second rotatable inserts creates a first cooling liquid flow direction, and the second position of the first and second rotatable inserts creates a second cooling liquid flow direction.

8. The cooling liquid flow switch of claim 1, wherein the first and second positions are perpendicular to each other.

9. An information handling system comprising:
   a processor;
   a cold plate to provide liquid cooling to the processor;
   a cooling distribution unit to provide a cold liquid flow to the cold plate and to receive a hot liquid flow from the cold plate; and
   a cooling liquid flow switch coupled in between the cold plate and the cooling distribution unit, wherein the cold liquid flow and the hot liquid flow travel through the cooling liquid flow switch, the cooling liquid flow switch including:
      a top plate having a first opening in a center of the top plate, and a first plurality of flow channels;
      a first rotatable insert located within the first opening of the top plate, the first rotatable insert to rotate between first and second positions, the first rotatable insert to create a first liquid flow configuration within the first flow channels when in the first position, and the first rotatable insert to create a second liquid flow configuration within the first flow channels when in the second position;
      a bottom plate having a second opening in a center of the bottom top plate, and a second plurality of flow channels; and
      a second rotatable insert located within the second opening of the bottom plate, the second rotatable insert to rotate between the first and second positions, the second rotatable insert to create a third liquid flow configuration within the second flow channels when in the first position, and the second rotatable insert to create a fourth liquid flow configuration within the second flow channels when in the second position.

10. The information handling system of claim 9, wherein the cooling liquid flow switch further comprises a middle plate including third and fourth openings, the middle plate located in between the top and bottom plate, the third and fourth openings connect the first and second flow channels.

11. The information handling system of claim 9, wherein the cooling liquid flow switch further comprises a rod extending between the first and second rotatable inserts, wherein the rod causes the first and second rotatable inserts to rotate at a same time.

12. The information handling system of claim 11, wherein the cooling liquid flow switch further comprises:
   a first cooling liquid pipe in physical communication with a first edge of the top plate near a second edge of the top plate; and
   a second cooling liquid pipe in physical communication with a third edge of the top plate near the second edge of the top plate.

13. The information handling system of claim 12, wherein the cooling liquid flow switch further comprises:
   a third cooling liquid pipe in physical communication with a third edge of the bottom plate near a fourth edge of the bottom plate; and
   a fourth cooling liquid pipe in physical communication with a fifth edge of the bottom plate near the fourth edge of the top plate.

14. The information handling system of claim 13, when the top and bottom plates are stacked on each other, the second edge of the top plate and the fourth edge of the bottom plate are at distal ends of the top and bottom plates.

15. The information handling system of claim 9, wherein the first position of the first and second rotatable inserts creates a first cooling liquid flow direction, and the second position of the first and second rotatable inserts creates a second cooling liquid flow direction.

16. The information handling system of claim 9, wherein the first and second positions are perpendicular to each other.

17. A cooling liquid flow switch for an information handling system, the cooling liquid flow switch comprising:
   a top plate including:
      a first opening in a center of the top plate; and
      a first plurality of flow channels;
   a bottom plate including:
      a second opening in a center of the bottom top plate; and
      a second plurality of flow channels;
   a middle plate including third and fourth openings, the middle plate disposed between the top and bottom plate, the third and fourth openings connect the first and second flow channels;
   a first rotatable insert disposed within the first opening of the top plate, the first rotatable insert to rotate between first and second positions, the first rotatable insert to create a first liquid flow configuration within the first flow channels when in the first position, and the first rotatable insert to create a second liquid flow configuration within the first flow channels when in the second position;
   a second rotatable insert located within the second opening of the bottom plate, the second rotatable insert to rotate between the first and second positions, the second rotatable insert to create a third liquid flow configuration within the second flow channels when in the first position, and the second rotatable insert to create a fourth liquid flow configuration within the second flow channels when in the second position; and
   a rod extending between the first and second rotatable inserts, wherein the rod causes the first and second rotatable inserts to rotate at a same time.

18. The cooling liquid flow switch of claim 17, further comprising:
   a first cooling liquid pipe in physical communication with a first edge of the top plate near a second edge of the top plate; and
   a second cooling liquid pipe in physical communication with a third edge of the top plate near the second edge of the top plate.

19. The cooling liquid flow switch of claim 18, further comprising:
   a third cooling liquid pipe in physical communication with a third edge of the bottom plate near a fourth edge of the bottom plate; and a fourth cooling liquid pipe in physical communication with a fifth edge of the bottom plate near the fourth edge of the top plate.

20. The cooling liquid flow switch of claim 17, wherein the first position of the first and second rotatable inserts creates a first cooling liquid flow direction, and the second position of the first and second rotatable inserts creates a second cooling liquid flow direction.

* * * * *